(12) United States Patent
Chakravarthi et al.

(10) Patent No.: US 6,847,089 B2
(45) Date of Patent: Jan. 25, 2005

(54) GATE EDGE DIODE LEAKAGE REDUCTION

(75) Inventors: Srinivasan Chakravarthi, Richardson, TX (US); Suresh Potla, Plano, TX (US); Gordon P. Pollack, Richardson, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/407,128

(22) Filed: Apr. 3, 2003

(65) Prior Publication Data

US 2004/0195633 A1 Oct. 7, 2004

(51) Int. Cl.[7] .................. H01L 29/76; H01L 29/94; H01L 31/062; H01L 31/113; H01L 31/119
(52) U.S. Cl. ........................ 257/408; 257/369
(58) Field of Search ................. 257/369, 408

(56) References Cited

U.S. PATENT DOCUMENTS 6,436,783 B1 * 8/2002 Ono et al. .............. 438/366

OTHER PUBLICATIONS

H.H. Vuong, et al., "Influence of Fluorine Implant on Boron Diffusion: Determination of Process Modeling Parameters" J. Appl. Phys. 77 (7), Apr. 1, 1995, pp. 3056–3060.

Song Zhao, et al., "GIDL Simulation and Optimization for 0.13μm/1.5V Low Power CMOS Transistor Design" 2002 International Conference on Simulation of Semiconductor Processes and Devices, pp. 43–48.

* cited by examiner

*Primary Examiner*—Long Pham
(74) *Attorney, Agent, or Firm*—Rose Alyssa Keagy; W. James Brady, III; Frederick J. Telecky, Jr.

(57) ABSTRACT

An embodiment of the invention is an integrated circuit 2 having halo atoms 12 concentrated at a gate side of a channel region and impurity atoms 14 within the channel region. Another embodiment of the invention is a method of manufacturing an integrated circuit that includes the implantation of impurity atoms 14 into a semiconductor substrate 11.

4 Claims, 4 Drawing Sheets

GATE EDGE DIODE LEAKAGE REDUCTION

BACKGROUND OF THE INVENTION

This invention relates to the addition of a sub amorphizing implant to reduce the halo atom concentration at the source and drain extension junctions while maintaining the halo atom concentration close to the substrate surface of the channel region.

DETAILED DESCRIPTION OF THE INVENTION

Figure 1:
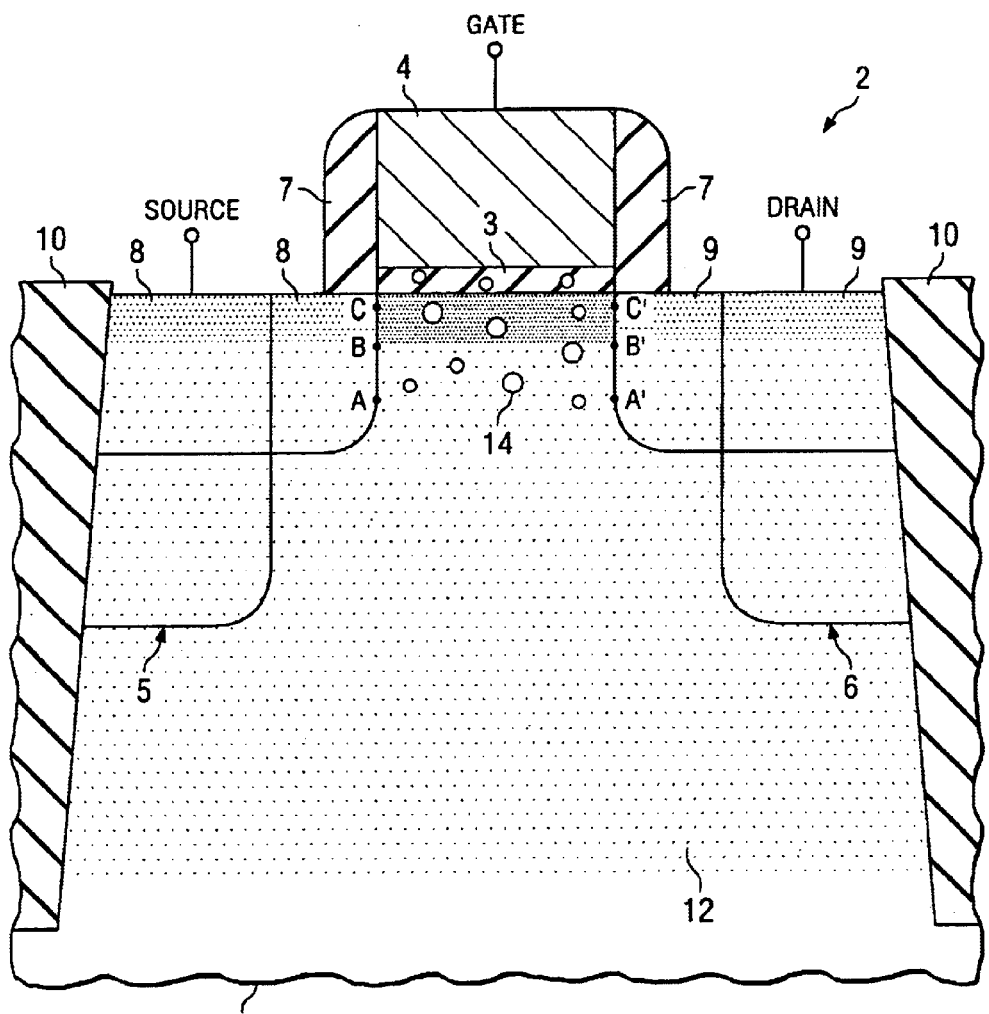
FIG. 1 is a cross-section view of a partial integrated circuit in accordance with the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-section view of a partial integrated circuit 2 in accordance with the present invention. A CMOS transistor is formed generally with a gate oxide 3, a gate electrode 4, a source 5, and a drain 6. In addition the transistor has gate sidewalls 7, a source extension 8, and a drain extension 9.

This transistor is electrically insulated from other active devices by a shallow trench isolation structure ("STI") 10 formed within the semiconductor substrate 11; however, any conventional isolation structure may be used such as field oxidation regions (also known as LOCOS regions) or implanted regions. The semiconductor substrate 11 is a single-crystal silicon substrate that is doped to be n-type; however, it may be doped p-type or may be formed by fabricating an epitaxial silicon layer on a single-crystal substrate.

In accordance with the present invention an implant of a foreign species, such as fluorine, into the lattice of the substrate 11 accelerates the diffusion of the halo implant during the anneal process, resulting in a change in the location of the flow of the diode leakage current from A–A' to B–B'. The diode leakage current (called the Gate Edge Diode Leakage, or "GEDL") is reduced by changing the location of the diode leakage at the extension junction from A–A' to B–B' because the dopant concentration (i.e. arsenic concentration) of the extension region is lower at points A, A' than at points B, B'. This reduction in GEDL (i.e. the off-state current leakage) reduces the power consumption of the integrated circuit.

In this application a high channel dopant ("halo dopant") such as boron 12 is used to control the sub-threshold leakage, which is the current flowing through the channel region from C to C'. The accelerated diffusion of the halo atoms (prompted by the foreign species) also facilitates the use of a lower halo atom doping level because of the resulting accumulation of halo atoms at the sub-threshold channel region C–C'. More specifically, the sub-threshold current can be held constant even though the halo doping level dropped because the accelerated diffusion of the halo atoms caused an increased concentration of halo atoms near the gate oxide 3. Thus the sub-threshold current level (i.e. the drive current) is maintained even though the halo dopant level was decreased.

Figure 2:
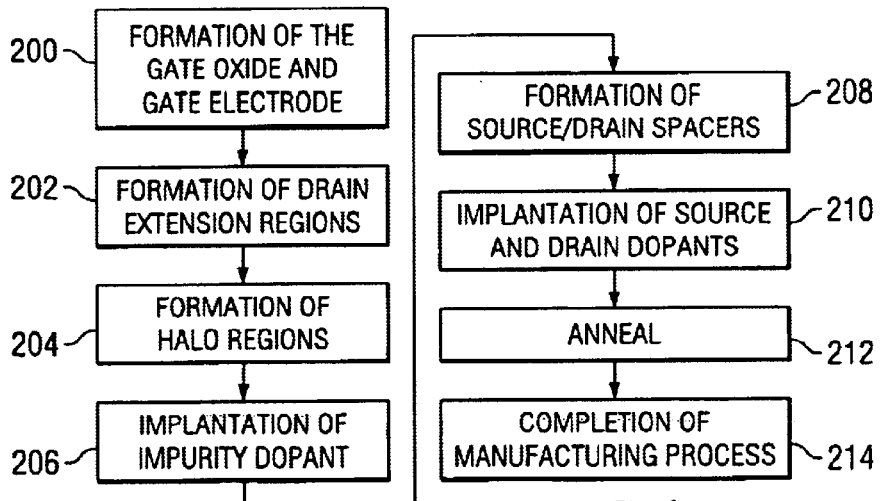
FIG. 2 is a flow chart illustrating the process flow of one embodiment of the present invention.
Figure 3A:
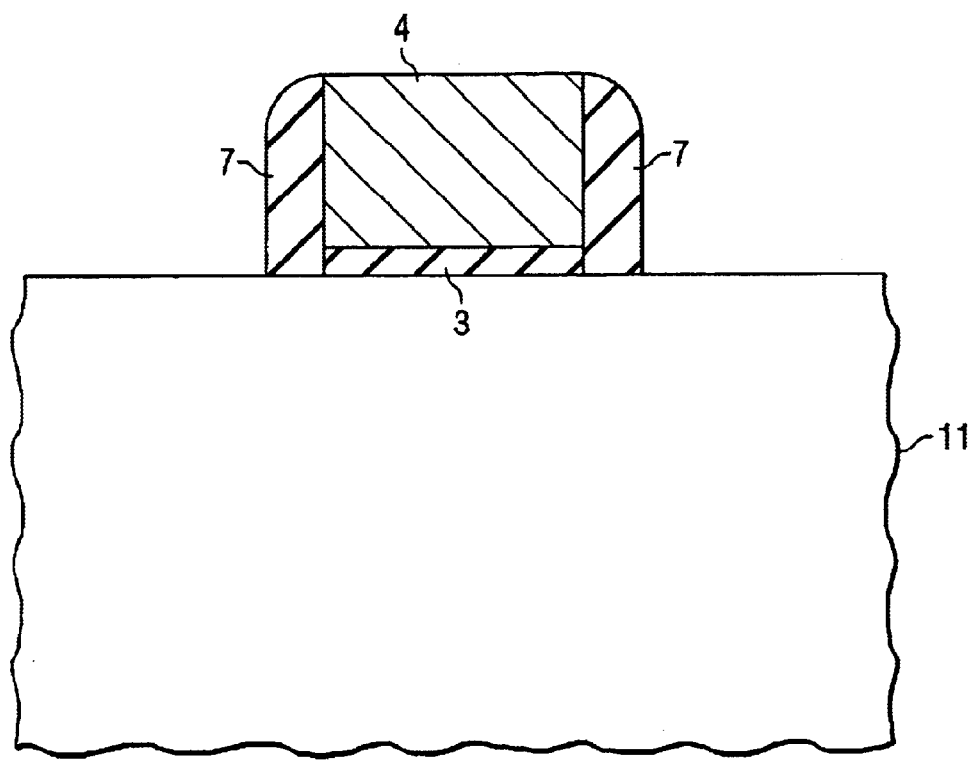
FIGS. 3A–3F are cross-sectional views of a partially fabricated semiconductor wafer in accordance with one embodiment of the present invention.
Figure 3B:
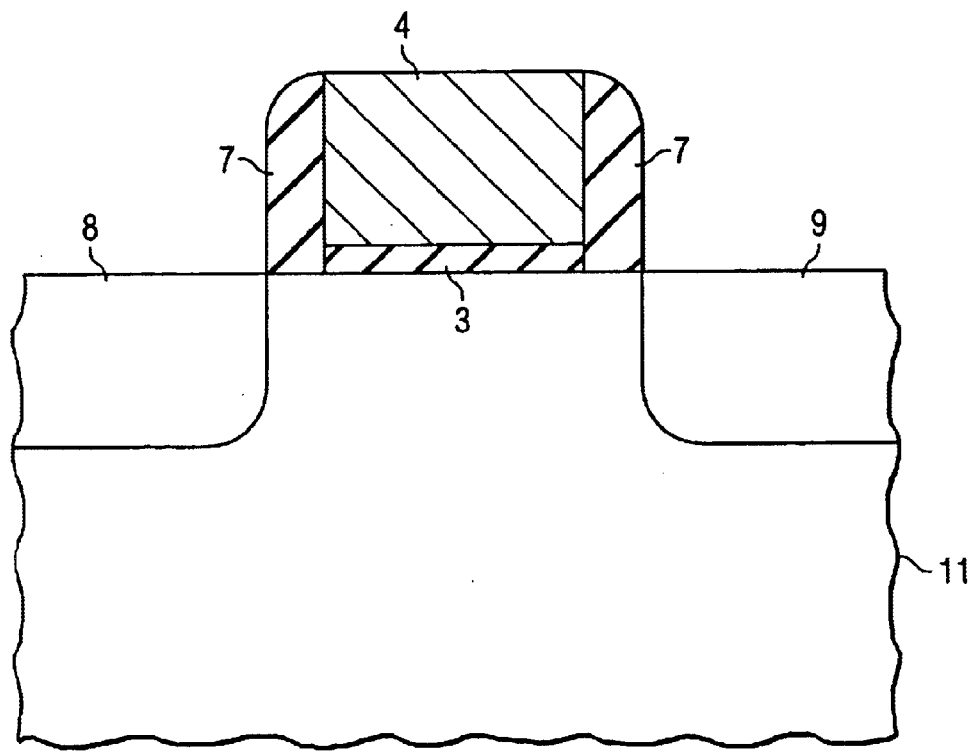

FIG. 2 is a flow chart illustrating the process flow of one embodiment of the present invention. In addition, FIGS. 3A–3F are cross-sectional views of a partially fabricated semiconductor wafer in accordance with one embodiment of the present invention. Other than process step 206, the manufacturing process steps should be those standard in the industry. The first step is the formation of the gate (step 200), as shown in FIG. 3A. A gate oxide layer 3 (preferably comprised of silicon dioxide, an oxynitride, a silicon nitride, BST, PZT, a silicate, any other high-k material, or any combination or stack thereof) is formed on the substrate 11. Then a gate electrode 4 (preferably comprised of polycrystalline silicon doped either p-type or n-type with a silicide formed on top, or a metal such as titanium, tungsten, TiN, tantalum, or TaN) is formed on the gate oxide layer 3. Next the gate sidewalls 7 (preferably comprised of oxide, a nitride, an oxynitride or a combination or stack thereof) are formed, thereby creating an offset space adjacent to the gate stack 3, 4.

Step 202 (FIG. 3B) is the formation of the source and drain extensions 8, 9. The ordering of this step is exemplary as the source and drain extensions may be created either earlier or later in the process. Implanting a dopant such as arsenic into the substrate 11 forms the source/drain extensions 8, 9. The presence of gate sidewalls 7 creates a separation between the source/drain extension regions 8, 9 and the gate stacks 3, 4.

Figure 3C:
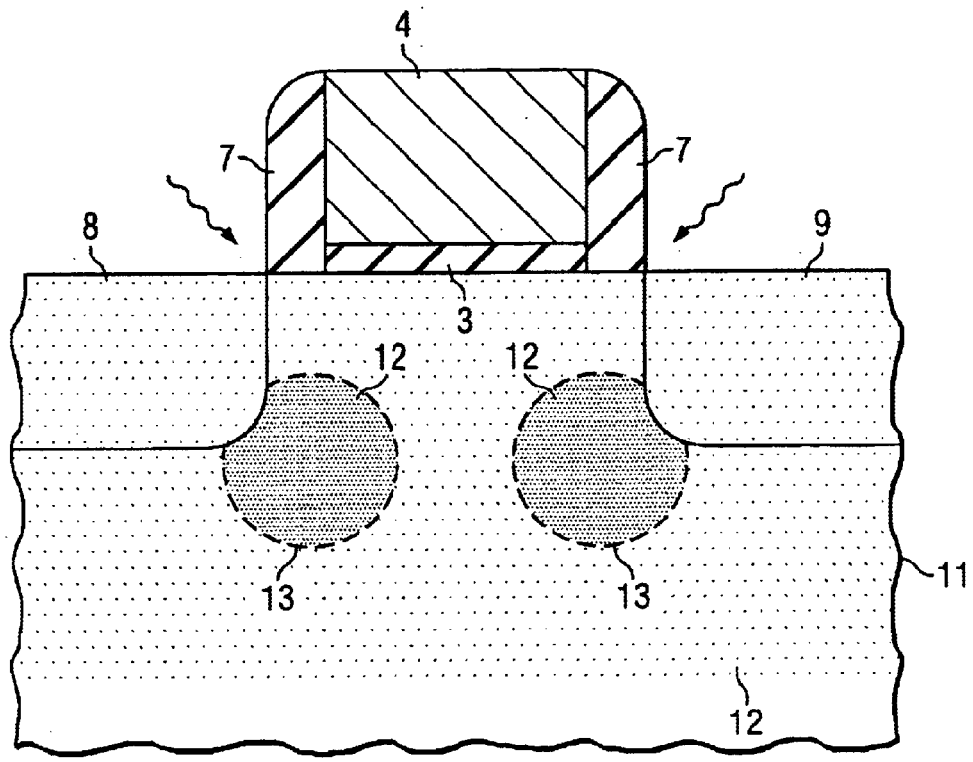

As shown in FIG. 3C, the regions of a halo dopant are now formed (step 204). The ordering of this step is also exemplary as the halo regions 13 may be created either earlier or later in the process. The halo regions 13 are formed by focusing the implantation of a dopant such as boron into the channel region in an area that is close to the source and drain extension junctions (i.e. the edge of the source and drain extensions). Generally this is accomplished by implanting the dopants into the semiconductor wafer at an angle, as indicated in FIG. 3C. However, it is within the scope of this invention to implant the halo dopants at other tilts and angles—including a perpendicular angle. Furthermore, instead of using boron as the halo implant, the use of any halo dopant, such as indium, is within the scope of this invention.

Figure 3D:
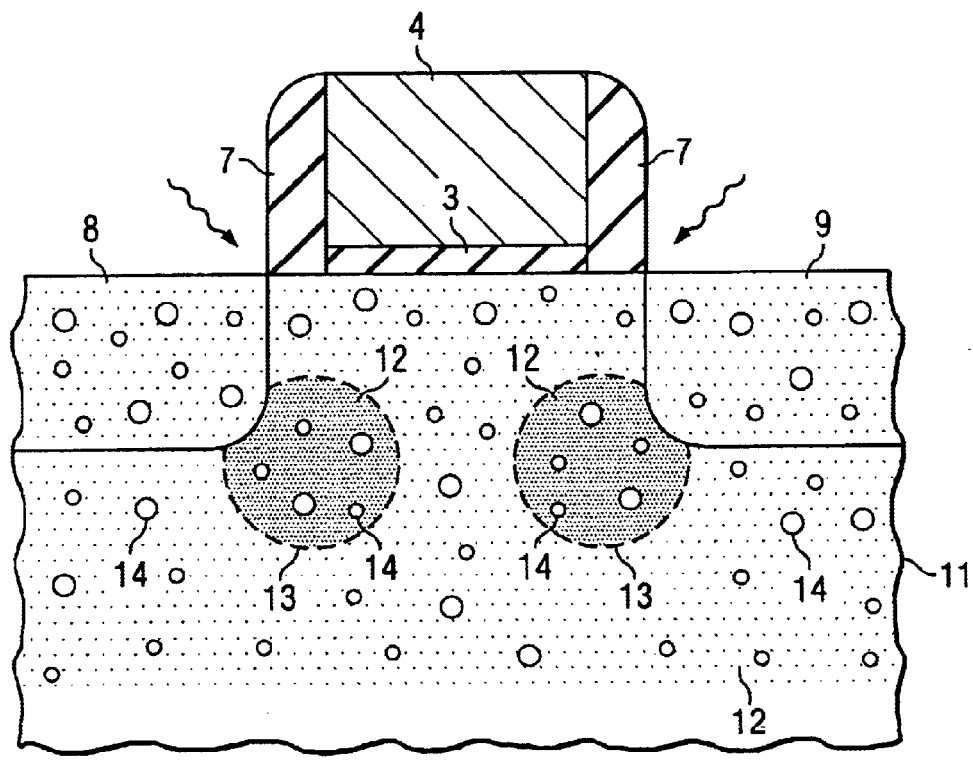

In accordance with the invention, the impurity implant of a foreign species, such as fluorine, is now performed (step 206) as shown in FIG. 3D. The ordering of this step is also exemplary as the impurity implant may be performed either earlier or later in the process. In the best mode application, the impurity dopants 14 are implanted to approximately the same depth as the halo dopants. In addition, the impurity dopants 14 are implanted at an angle into the semiconductor wafer and the dopants are directed to the halo region 13 (as indicated in FIG. 3D). However, it is within the scope of this invention to implant the impurity dopants at other tilts and angles—including a perpendicular angle. Furthermore, instead of using F as the impurity dopant, the use of any other impurity dopants such as Si or Ge is within the scope of this invention.

Figure 3E:
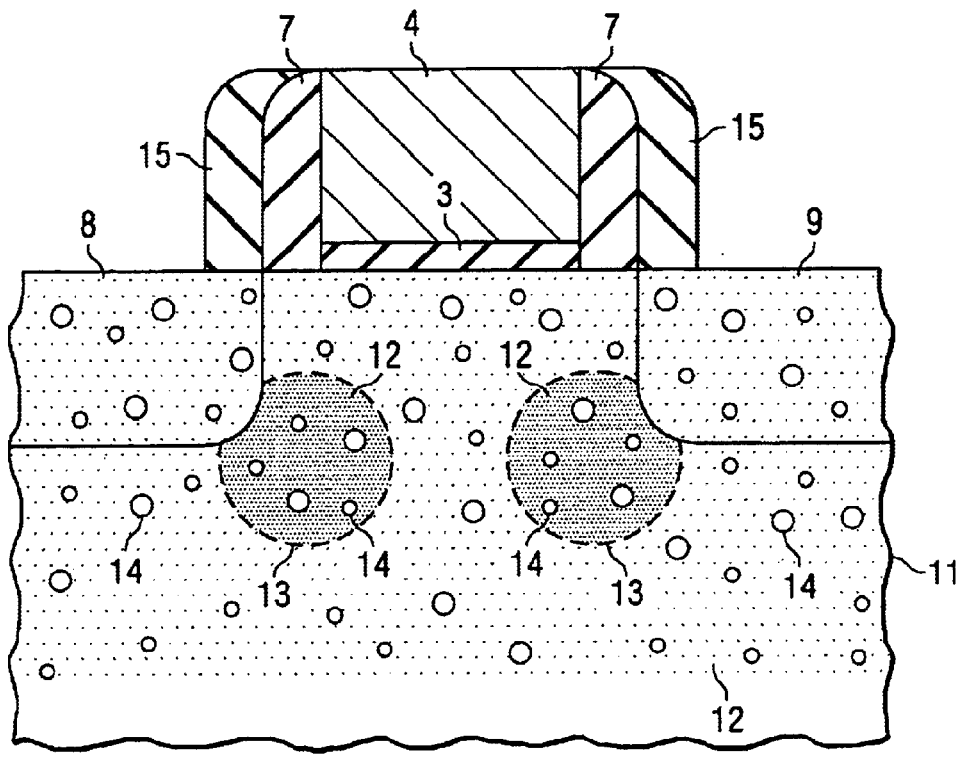
Figure 3F:
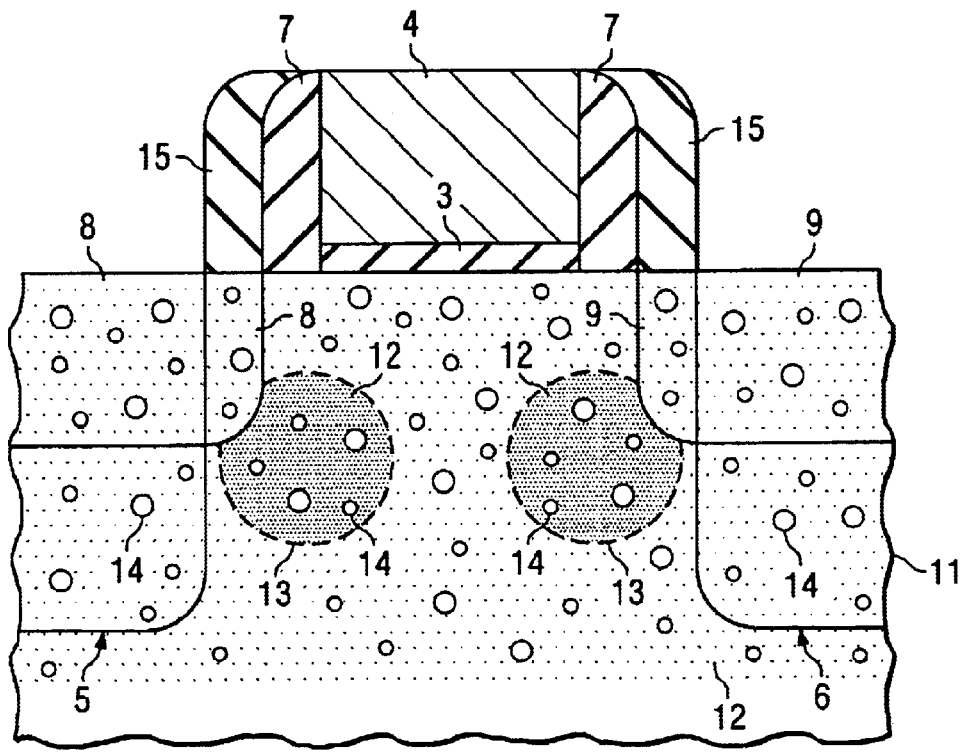

Step 208 is the formation of the source/drain spacers 15. As shown in FIG. 3E, the source/drain spacers 15 (preferably comprised of an oxide/nitride stack, but alternatively an oxide, a nitride, an oxynitride, or any suitable material) are formed, thereby creating an offset space adjacent to the gate sidewalls 7. The presence of source/drain spacers 15 acts to create a separation between the source/drain extension regions 8, 9 and the source 5 or drain 6.

Step 210 (FIG. 3F) is the implantation of dopants to create a source 5 and a drain 6. A dopant such as AsP is implanted into the substrate 11 at the source region 5 and the drain region 6. The presence of source/drain spacers 15 creates the proper separation between the source/drain extension regions 8, 9 and the source and drain 5, 6.

As an example, the halo dose (i.e. boron) may be in the range of $5.2e^{13}$ atoms/cm$^2$ to $6e^{13}$ atoms/cm$^2$, which may represent as much as a 13% decrease in halo dopant level. The impurity implant dose (i.e. fluorine) may be in the range of $5e^{13}$ atoms/cm$^2$ to $1e^{15}$ atoms/cm$^2$. However, any level of impurity implant may be used as long as it doesn't amorphize the substrate 11. Lastly, the power level may range from 1–30 KeV.

Next, the semiconductor wafer is annealed (step 212). Annealing causes the dopants in the source 5, drain 6, and source/drain extension regions 8, 9 to diffuse. Most importantly, the annealing causes the halo dopant to diffuse at an accelerated pace. The result is that there is a desirable concentration of halo dopants (i.e. boron) at the drain extension junctions and in the channel region near the gate oxide (as shown in FIG. 1). The annealing process also causes the impurity atoms (i.e. fluorine) to move to the channel region of the substrate 11 closest to the gate oxide 3, or to the gate oxide 3, or to the interface between the channel region and the gate oxide 3. Now the manufacturing process continues until the final integrated circuit structure is complete (step 214).

Various modifications to the invention as described above are within the scope of the claimed invention. For example, instead of using the silicon crystal semiconductor substrate described above, GaAs and InP may be used. In addition to a semiconductor crystal, the substrate may include various elements therein and/or layers thereon. The invention is applicable to semiconductor wafers having different well and substrate technologies or transistor configurations. Furthermore, the integrated circuit may use any number of various metal layers, barrier layers, device structures, active elements and passive elements. Instead of implementing the invention in an nMOSFET (as described above), the invention may be used in a pMOSFET where fluorine is implanted in combination with a phosphorous or arsenic halo implant (and then boron may be used for the source and drain region). Moreover, the invention is applicable to any semiconductor technology such as BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit comprising:

a semiconductor substrate;

a gate coupled to said semiconductor substrate;

a source region within said semiconductor substrate, said source region electrically coupled to said gate;

a drain region within said semiconductor substrate, said drain region electrically coupled to said gate;

a source extension region within said semiconductor substrate, said source extension region coupled to said source region;

a drain extension region within said semiconductor substrate, said drain extension region coupled to said drain region;

a channel region within said semiconductor substrate, said channel region coupled to said gate, said source extension region, and said drain extension region;

halo atoms within said channel region, said halo atoms being more concentrated at a gate side of said channel region, and said halo atoms being less concentrated at a source extension region side and a drain extension region side of said channel region; and impurity atoms within said integrated circuit.

2. The integrated circuit of claim 1 wherein said gate, said source region, and said drain region form a CMOS transistor.

3. The integrated circuit of claim 1 wherein said impurity atoms are fluorine.

4. The integrated circuit of claim 1 wherein said halo atoms are boron.

* * * * *